US009404265B2

(12) United States Patent
Gliessman

(10) Patent No.: US 9,404,265 B2
(45) Date of Patent: Aug. 2, 2016

(54) HIGH EFFICIENCY SCALABLE STRUCTURE

(75) Inventor: Perry Gliessman, Hillsboro, OR (US)

(73) Assignee: OREGON HEALTH & SCIENCE UNIVERSITY, Portland, OR (US)

( * ) Notice: Subject to any disclaimer, the term of this patent is extended or adjusted under 35 U.S.C. 154(b) by 206 days.

(21) Appl. No.: 14/232,597

(22) PCT Filed: Jul. 13, 2012

(86) PCT No.: PCT/US2012/046641
§ 371 (c)(1),
(2), (4) Date: Aug. 4, 2014

(87) PCT Pub. No.: WO2013/010068
PCT Pub. Date: Jan. 17, 2013

(65) Prior Publication Data
US 2014/0345207 A1 Nov. 27, 2014

Related U.S. Application Data

(60) Provisional application No. 61/507,521, filed on Jul. 13, 2011.

(51) Int. Cl.
F24F 7/04 (2006.01)
E04H 5/00 (2006.01)
(Continued)

(52) U.S. Cl.
CPC .............. *E04D 13/0325* (2013.01); *E04B 9/02* (2013.01); *F24F 5/005* (2013.01); *H05K 7/20745* (2013.01); *F24F 2011/0006* (2013.01); *Y02B 10/40* (2013.01); *Y02B 30/547* (2013.01)

(58) Field of Classification Search
CPC ...... Y02B 30/547; Y02B 30/54; Y02B 80/40; F24F 2007/004; F24F 5/0046; F24F 5/005; F24F 2005/0053; F24F 7/10; F24F 2011/0006; E04H 2005/005
See application file for complete search history.

(56) References Cited

U.S. PATENT DOCUMENTS 1,749,343 A * 3/1930 Hersh .................... A23L 3/3418
454/250
4,842,048 A * 6/1989 Higaki ...................... F24D 5/00
165/45
(Continued)

FOREIGN PATENT DOCUMENTS

DE 202011050979 U1 * 11/2011 ......... H05K 7/20745
FR 2941517 A1 * 7/2010 ............... F24D 3/08
(Continued)

OTHER PUBLICATIONS

European Search Report for European Patent Application No. 12811454.3, dated Mar. 9, 2015, 7 pages.
(Continued)

Primary Examiner — Christine T Cajilig
(74) Attorney, Agent, or Firm — Marger Johnson

(57) ABSTRACT

A building may include a floor, a dome having a vent, and an internal ceiling that divides areas underneath the dome into first and second chambers. The internal ceiling may have an aperture that is structured to allow air to pass from the first chamber into the second chamber. The building may also include an air inlet configured to allow air to travel from outside the building into the first chamber and an air moving device that is configured to facilitate the movement of the air. The building may also include an air cooling element that is configured to cool the air as it travels from outside the building into the first chamber.

36 Claims, 10 Drawing Sheets

(51) Int. Cl.
*E04D 13/03* (2006.01)
*F24F 5/00* (2006.01)
*H05K 7/20* (2006.01)
*E04B 9/02* (2006.01)
*F24F 11/00* (2006.01)

(56) References Cited

U.S. PATENT DOCUMENTS

| | | | | |
|---|---|---|---|---|
| 6,293,120 B1* | 9/2001 | Hashimoto | ............ | F24D 11/006 165/45 |
| 2004/0006926 A1* | 1/2004 | Neeley | .................... | A63B 69/00 52/6 |
| 2006/0052051 A1* | 3/2006 | Daniels, II | ............ | E04D 12/004 454/365 |
| 2007/0214733 A1* | 9/2007 | Braun | ...................... | E04H 3/02 52/79.6 |
| 2011/0009047 A1* | 1/2011 | Noteboom | ......... | H05K 7/20745 454/184 |
| 2011/0138708 A1* | 6/2011 | Chazelle | .................... | E04H 1/06 52/173.1 |
| 2012/0311941 A1* | 12/2012 | Edwards | ................... | E04B 7/08 52/79.9 |
| 2012/0318475 A1* | 12/2012 | Glover | ..................... | F24D 5/02 165/47 |

FOREIGN PATENT DOCUMENTS

| | | | | |
|---|---|---|---|---|
| FR | 2962793 A1 * | 1/2012 | ............ | F24F 5/0046 |
| GB | WO 02052107 A2 * | 7/2002 | ................ | E04H 5/02 |
| JP | 57060149 A | 4/1982 | | |
| JP | 05-141016 A | 6/1993 | | |
| JP | 06-346469 A | 12/1994 | | |
| JP | 2005-336768 A | 12/2005 | | |
| JP | 5221994 B2 * | 6/2013 | ............ | F24F 5/005 |
| KR | 10-0731328 B1 | 6/2007 | | |
| NL | WO 2010036106 A1 * | 4/2010 | ......... | F24F 11/0001 |
| TN | WO 2004046619 A1 * | 6/2004 | ................ | F24D 3/14 |
| WO | 2010036106 A1 | 4/2010 | | |

OTHER PUBLICATIONS

International Search Report for PCT/US2012/046641 dated Jan. 28, 2013, 5 pages, Korea.

* cited by examiner

HIGH EFFICIENCY SCALABLE STRUCTURE

CROSS-REFERENCE TO RELATED APPLICATIONS

This application is a 371 of International Application No. PCT/US/2012/046641, filed 13 Jul. 2012, which claims priority to U.S. Provisional Patent Application 61/507,521, filed 13 Jul. 2011, the contents of which are incorporated by reference herein in their entirety.

TECHNICAL FIELD

This invention generally relates to the field of buildings and, more particularly, to data centers or other structures configured to house electrical devices and equipment.

BACKGROUND

Modern data centers tend to face a variety of issues such as the need to meet or exceed high equipment density power and cooling requirements, particularly with the industry-wide desire to approach a power utilization efficiency (PUE) rating of 1.0. Data center equipment generally performs best with a relatively static ambient temperature to maximize efficiency and life expectancy. However, typical data center heating, ventilation, and air conditioning (HVAC) systems require a great amount of power and, consequently, pose significant operating costs, particularly with respect to operation and maintenance of the HVAC equipment. Furthermore, modern data centers are often negatively affected by environmental conditions such as unfavorable weather patterns and certain acts of nature, notably earthquakes, that can destroy part or all of the data center. Even if the physical damage brought on by such an event is limited, it can still have a widespread negative impact on the equipment housed within the data center.

Embodiments of the disclosed technology address these and other limitations and deficiencies in the prior art.

DETAILED DESCRIPTION

Embodiments of the disclosed technology are directed toward buildings and structures that may be suitable for use as data centers, for example. Certain embodiments may provide free air structures that are substantially passively cooled and eliminate the need for traditional heating, ventilation, and air conditioning (HVAC) systems. Consequently, such structures may significantly reduce or completely eliminate the massive power consumption and operating costs associated with typical HVAC systems.

In certain implementations, the buildings and structures may be readily scalable in that sub-portions of the structures may be added, removed, and modified. For example, one or more individual equipment rooms may be arranged within the structure to suit initial and modified requirements with respect to network fiber and electrical or data cable routing issues. Segregation of data center equipment may effectively mitigate heat, power, and security interactions therebetween.

In certain embodiments, portions of or even the entire structure are at least substantially subterranean. Thermal coupling of the structure with the ground may provide more effective and efficient regulation of the internal temperatures of the structure, sub-structures, and equipment therein. For example, the structure may be situated in a geographic location where the below-ground average temperature is approximately 50-55 degrees year-round to help maintain an ambient static temperature that is close to or even substantially equal to that of the ground.

Further, such structures may provide additional protection for equipment and personnel therein against exposures from regional disasters such as earthquakes and volcanic ash fallout. For example, in situations where the structure is at least substantially below grade, the structure may be further protected from above-ground harmonic shaking that is typically generated by earthquakes. Further, implementations including a hub-and-spoke arrangement, such as the data center illustrated in FIGS. 4 and 5 and described below, may provide a greater ability to withstand pressures generated by earthquakes.

Figure 1:
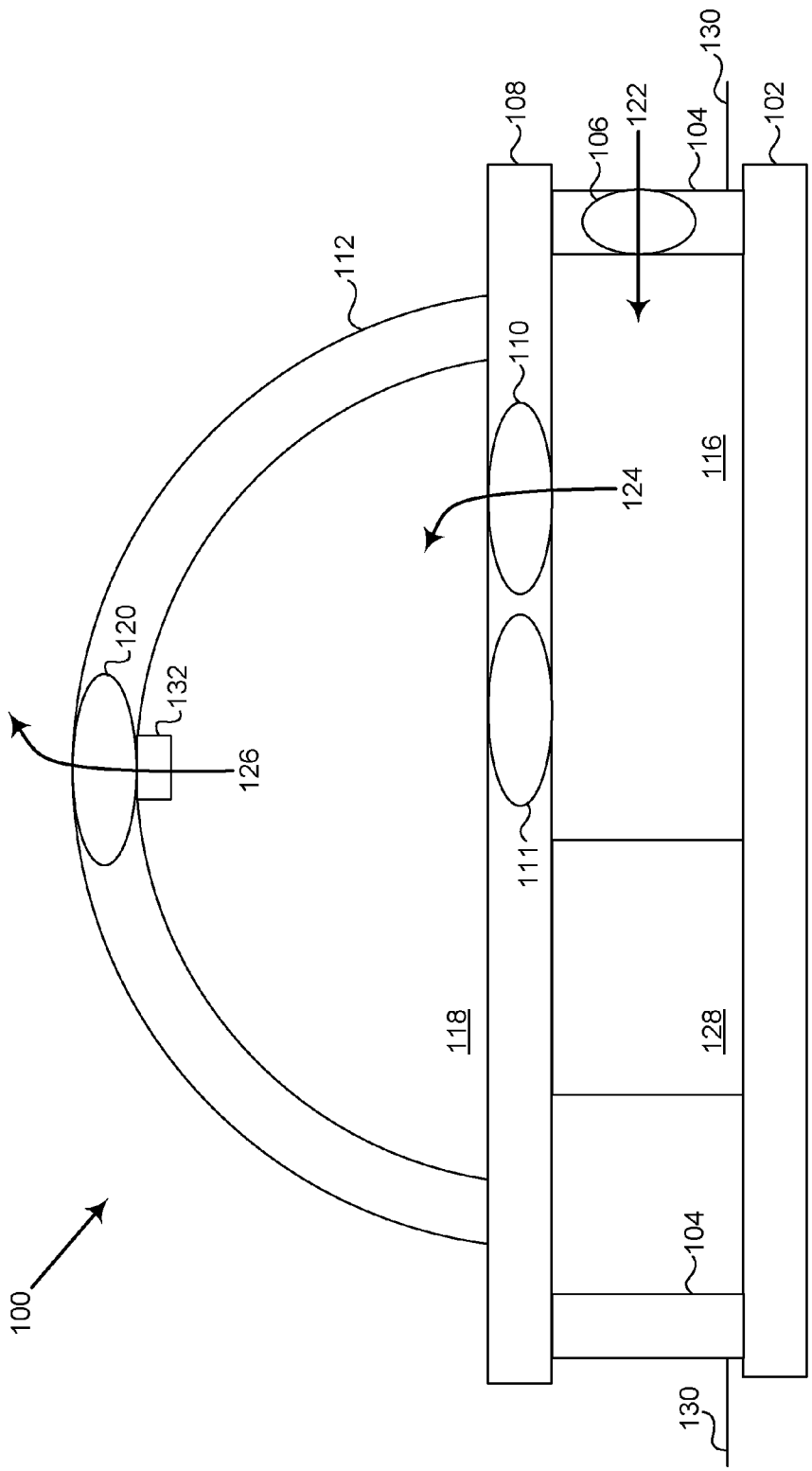
FIG. 1 illustrates a side view of a first example of a building in accordance with certain embodiments of the disclosed technology.

FIG. 1 illustrates a side view of a first example of a building 100 having a floor 102 and a dome 112. The floor 102 may be substantially subterranean, i.e., situated at least substantially below ground level. In the example, the floor 102 is situated completely below ground level 130. In certain embodiments, the floor 102 is situated at least approximately 10 feet below surface grade. The floor 102 may be constructed of a material that has a particular thermal transfer coefficient. For example, the floor 102 may be formed at least substantially from concrete. In certain embodiments, the floor 102 is a concrete slab platform having a generally circular shape with a diameter of at least approximately 110 feet and a thickness of at least approximately 12 inches.

In the example, the building 100 has an internal ceiling 108 that substantially divides areas underneath the dome 112 into a first chamber 116 and a second chamber 118. The internal ceiling 108 also includes an aperture 110 that is formed therethrough and provides a passageway for air to travel between the first chamber 116 and the second chamber 118.

In the example, the first chamber 116 is defined substantially between the floor 102 and the internal ceiling 108. In the example, the first chamber 116 is defined by the floor 102, the internal ceiling 108, and an outer wall 104 that is at least approximately circular in shape. Accordingly, the first chamber 116 is at least approximately circular in shape, having a diameter defined by the outer wall 104.

An air inlet 106 is disposed at least substantially in the first chamber 116 and is configured to allow air to travel from outside the building 100 into the first chamber 116, as indicated by 122. In the example, the air inlet 106 is defined by the outer wall 104. In other embodiments, the air inlet 106 may be formed at least substantially separately from the outer wall 104.

The air inlet 106 may include an air filter to remove particles or contaminants from the air as it travels therethrough, for example. Alternatively or in addition thereto, a biofilter (not shown) may be situated at least substantially proximate the air inlet 106 and structured to perform a biofilter function on the air as it travels therethrough. The biofilter may include virtually any type of biofilter such as natural vegetation planted and cultivated in the ground 130 at least substantially proximate to the air inlet 106, for example.

Any number of air inlets 106 may be used to facilitate the travel of air from outside the building 100 into the first chamber 116. In certain embodiments where there are multiple air inlets 106, some or all of the air inlets 106 may be controllable such that not all of the air inlets 106 are in an open position at the same time, for example. Further, the air inlets 106 may each have multiple positions such that each of the air inlets 106 may be only partially opened. In certain situations, e.g., where contaminated air is present, it may be desirable to temporarily curb or prevent airflow through some or all of the air inlets 106.

In the example, the second chamber 118 is defined substantially between the internal ceiling 108 and the dome 112. As noted above, the internal ceiling 108 has an aperture 110 that is formed therein and provides a passageway for air to move between the first chamber 116 and the second chamber 118. Consequently, the internal ceiling 108 is structured to allow air to pass therethrough, as indicated by 124.

There is virtually no limit to the number of apertures 110 that may be formed in the internal ceiling 108 to provide passageway for air to travel from the first chamber 116 to the second chamber 118 or vice versa. In certain embodiments where there are multiple apertures 110, some or all of the apertures 110 may be controllable such that not all of the apertures 110 need be open at the same time or to the same extent, for example. In certain embodiments, the internal ceiling 108 may include a recirculation aperture 111 in addition to the apertures 110 to allow air to travel between the first and second chambers, for example.

The dome 112 may be constructed of a sturdy yet relatively lightweight material. For example, the dome 112 may be formed at least substantially from aluminum. In certain embodiments, the dome 112 has a base diameter of at least approximately 110 feet. In certain embodiments, the dome 112 is at least partially supported directly by the floor 102. Alternatively or in addition thereto, the dome 112 may be supported by supporting structures, such as beams, that are integrated with or disposed at least substantially adjacent to the internal ceiling 108.

In the example, the dome 112 has a single vent 120. However, the number and arrangement of vents within the dome 112 are virtually unlimited. For example, the dome 112 may have a certain number of vents such that the total surface area provided by the vents for passage therethrough, e.g., 1,500 square feet, is at least substantially equal to the total surface area provided by the air inlets 106 for passage therethrough. In this manner, a parametric ratio may be established.

In certain embodiments, the total surface area provided by the vent(s) of the dome 112 for passage therethrough is greater than or at least substantially equal to the total surface area provided by the aperture(s) 110 for passage therethrough. Such embodiments may also provide that the total surface area provided by the aperture(s) 110 is greater than or at least substantially equal to total surface area provided by the air inlets 106 for passage therethrough. One or more parametric ratios, e.g., between the vent(s) and the aperture(s), may be established in these embodiments.

In the example, the building 100 further includes at least one air moving device 132 that is configured to facilitate movement of air from outside the building 100 through the first and second chambers 116 and 118, and out through the vent 120 of the dome 112, as indicated by 122, 124, and 126, respectively. In the example, the air moving device 132 is a single boost fan or other comparable device that is at least substantially disposed at the vent 120 of the dome 112. In other embodiments, the air moving device 132 may be positioned elsewhere within the building 100. The air moving device 132 may include multiple individual devices, subdevices, or components each situated at a particular position within the building 100. For example, the air moving device 132 may include one or more fans situated within either or both of the first and second chambers 116 and 118.

The air moving device 132 may be controllable such that different states of the air moving device 132 may impact the overall flow of air through the building 100. For example, the air moving device 132 may include one or more fans having adjustable speeds such that a higher the fan speed would result in a higher air flow rate throughout the building 100.

In certain embodiments, the building 100 includes an air cooling element, described below, that is disposed substantially at the air inlet 106 and is configured to cool the air as it travels from outside the building into the first chamber, as indicated by 122. The air cooling element may be an evaporative cooling device or a device structured to cool air by a ground coupling effect, other comparable device, or a combination of any of these devices, for example.

In the example, the building 100 includes an equipment room 128 that is configured to house one or more electronic devices such as servers or other equipment that is generally used in connection with data centers. In certain embodiments, the floor 102 provides the floor of the equipment room 128. Alternatively, the equipment room 128 may have its own floor that is at least substantially adjacent to the floor 102. For example, the equipment room 128 may have a floor raised from the floor 102 surface. The internal ceiling 108 may provide the ceiling of the equipment room 128. Alternatively, the equipment room 128 may have its own separate ceiling that is at least substantially adjacent to the internal ceiling 108.

Figure 2:
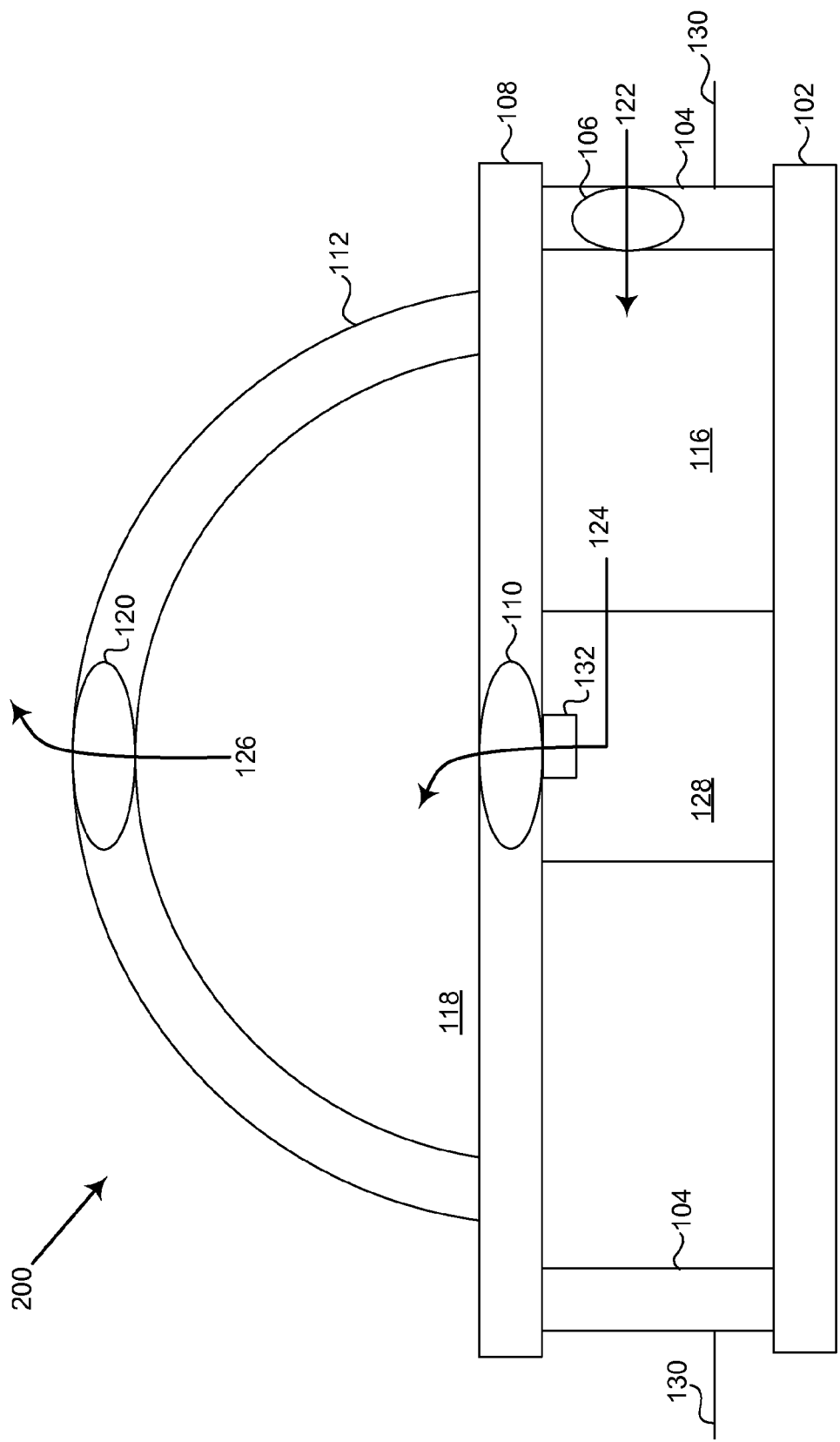
FIG. 2 illustrates a side view of a second example of a building in accordance with certain embodiments of the disclosed technology.

FIG. 2 illustrates a side view of a second example of a building 200. The building 200 is substantially similar to the building 100 of FIG. 1 in that the building 200 has a floor 102 and a dome 112, an internal ceiling 108 that substantially divides areas underneath the dome 112 into a first chamber 116 and a second chamber 118, wherein the first chamber 116 is also defined by an outer wall 104.

Similar to the building 100 of FIG. 1, the building 200 of FIG. 2 also has an aperture 110 that is formed in the internal ceiling 108 and an air inlet 106 that is defined by the outer wall 104. Further, air is allowed to move from outside the building 200 into the first chamber 116 by way of the air inlet 106 defined by the outer wall 104, as indicated by 122.

In the example, however, the equipment room 128 of the building 200 is situated beneath the aperture 110 formed in the internal ceiling 108 such that the air that travels from the first chamber 116 to the second chamber 118, as indicated by 124, must pass through the equipment room 128. Further, the air moving device 132 is situated within the equipment room 128.

In certain embodiments, the floor 102 is configured to support one or more electronic devices within the equipment room 128 such as a server rack or other equipment that might be used in connection with a data center, for example. In these embodiments, the air moving device 132 may include a fan situated within the equipment room 128 and structured to draw air from the first chamber 116 and direct the air into the second chamber 118, as indicated by 124. The fan may be a fan implemented within or in connection with one or more of the electronic devices in the equipment room 128.

Figure 3:
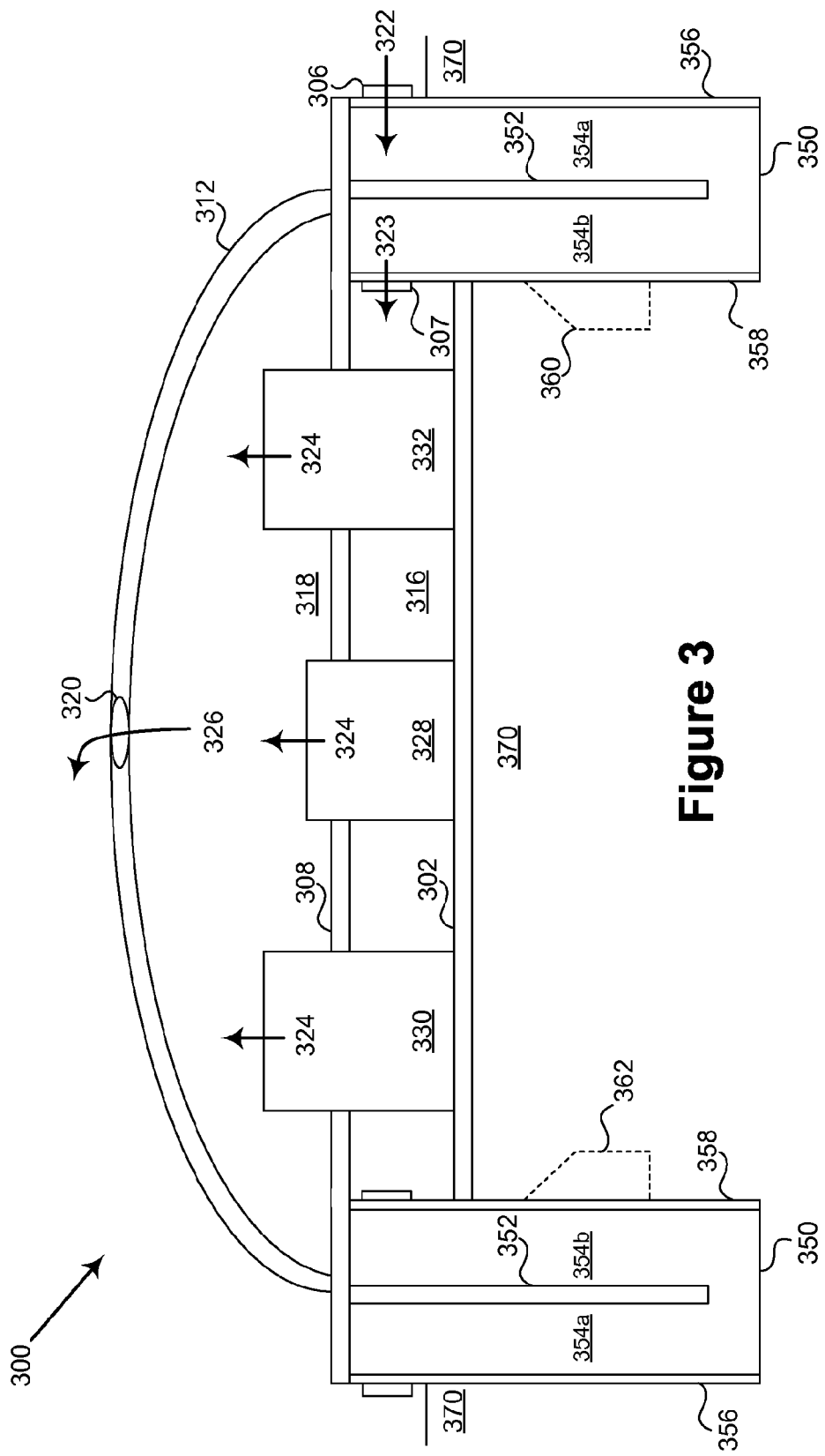
FIG. 3 illustrates a side view of a third example of a building in accordance with certain embodiments of the disclosed technology.

FIG. 3 illustrates a side view of a third example of a building 300 having a floor 302 and a dome 312 having a vent 320. The building 300 also has an internal ceiling 308 that substantially divides the area beneath the dome 312 into a first chamber 316 and a second chamber 318. An air inlet 306 is configured to allow air to pass from outside the building 300 into an air cooling element, as indicated by 322.

In the example, the air cooling element includes an earth cooling chamber 350 that is situated proximate the air inlet 306 and the first chamber 316. As used herein, the term earth cooling chamber or labyrinth refers to a structure that is situated at least partially underground, e.g., below the ground surface level, and is configured to allow air to travel from outside the building 300 through the earth cooling chamber 350 and into the first chamber 316. The earth cooling chamber 350 is also configured to cool the air or allow the air to be cooled as it travels therethrough.

In the example, the earth cooling chamber 350 is at least substantially circular in shape when viewed from the top and primarily includes a substantially vertical chamber 354 through which air passes between the air inlet 306 and an exit 307 into the first chamber 316, as indicated by 323. The earth cooling chamber 350 includes and is substantially defined by at least two ground soil-adjacent walls: an outer wall 356 and an inner wall 358. In certain embodiments, at least one of the two walls 356 and 358 of the earth cooling chamber 350 is a thermal coupling medium between air in the earth cooling chamber 350 and ground soil 370. The walls 356 and 358 may be constructed of sheet piling, heavy gauge metal, or other material suitable to be driven into the ground during construction of the earth cooling chamber 350.

A separating portion 352, such as a blocking wall that includes a partial wall or full wall with an opening or passageway therein, is disposed between the two walls 356 and 358 and substantially divides the vertical chamber 354 into an outer chamber 354a and an inner chamber 354b. Consequently, air traveling to the first chamber 316 from outside the building 300 first passes through the outer chamber 354a and then the inner chamber 354b.

In certain embodiments, one or more thermally conductive structures such as thermal fins may be coupled to at least one of the ground soil-adjacent walls 356 and 358. Such thermal fins may be constructed of sheet metal or other suitable material. In the example, two thermal fins 360 and 362 are shown as being optionally coupled to the inner wall 358. However, there is virtually no limit to the number, arrangement, or orientation of such thermally conductive structures used in connection with embodiments of the disclosed technology.

For example, other thermally conductive structures may be coupled to the outer wall 356, alternatively or in addition to the thermal fins 360 and 362 being coupled to the inner wall 358. Also, one or more of the thermal fins 360 and 362 may be oriented in a horizontal manner instead of a vertical manner as illustrated in the figure. Further, some or all of the thermal fins 360 and 362 may extend further into the ground than indicated in the illustration.

In the example, three equipment rooms 328, 330, and 332 are situated within the first chamber 316 such that the top of each room protrudes through the internal ceiling 308 into the second chamber 318. The equipment rooms 328, 330, and 332 are each configured to allow air therethrough into the second chamber 318, as indicated by 324. In certain embodiments, electronic devices within one or more of the equipment rooms 328, 330, and 332, e.g., servers, may have fans that are structured to draw air from the first chamber 316 and direct the air through the electronic devices into the second chamber 318, as indicated by 324. In this way, the electronic devices in the equipment rooms 328, 330, and 332 are cooled by the air passing through or across them.

In certain embodiments, less than all of the equipment rooms 328, 330, and 332 allow air to travel therethrough. For example, one or more of the equipment rooms 328, 330, and 332 may have shutters or blinds or other comparable mechanism for temporarily or permanently preventing air flow therethrough. Alternatively or in addition thereto, the internal ceiling 308 may have an aperture, e.g., similar to aperture 110 in FIGS. 1 and 2, configured to allow air to travel from the first chamber 316 to the second chamber 318 therethrough.

Figure 4:
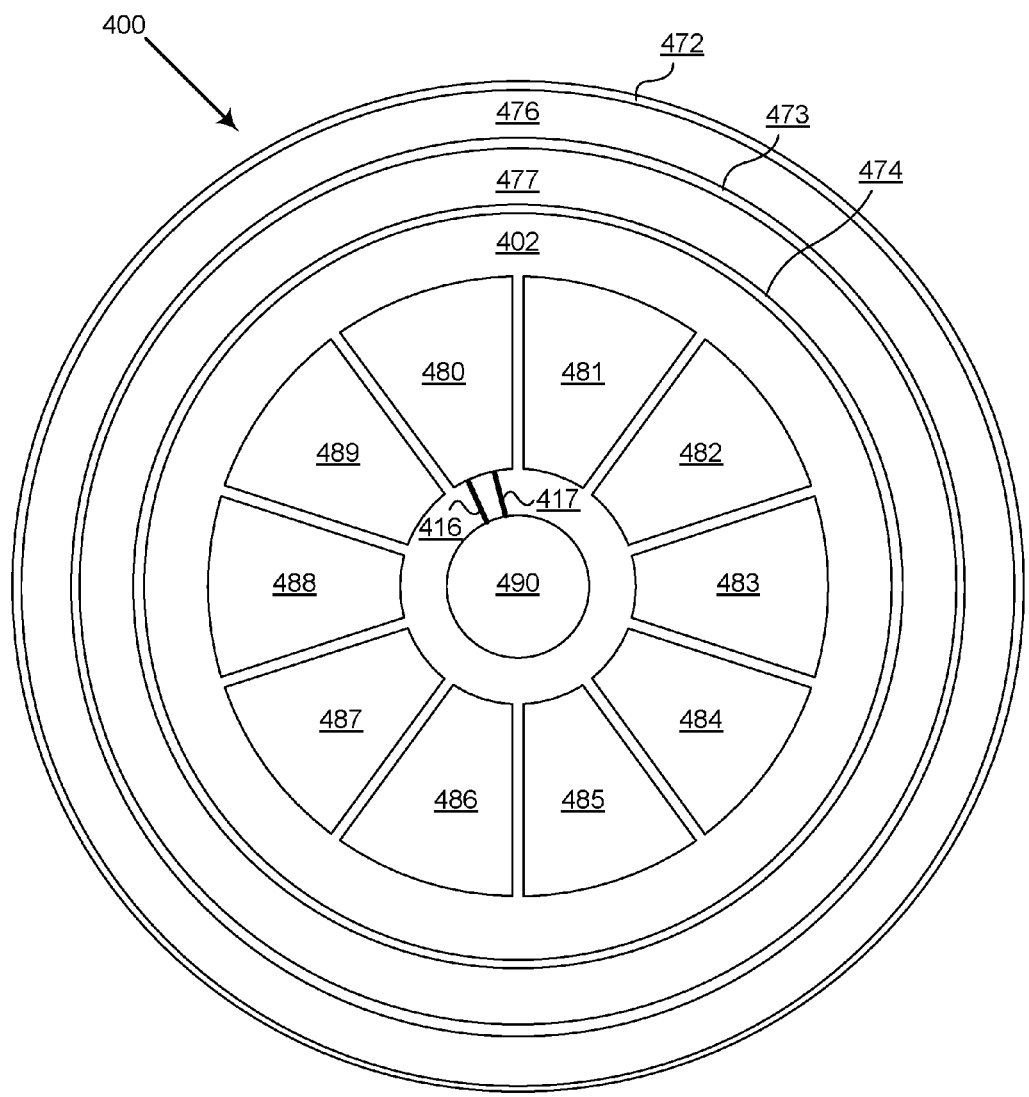
FIG. 4 illustrates a top view of a first example of a data center in accordance with certain embodiments of the disclosed technology.
Figure 5:
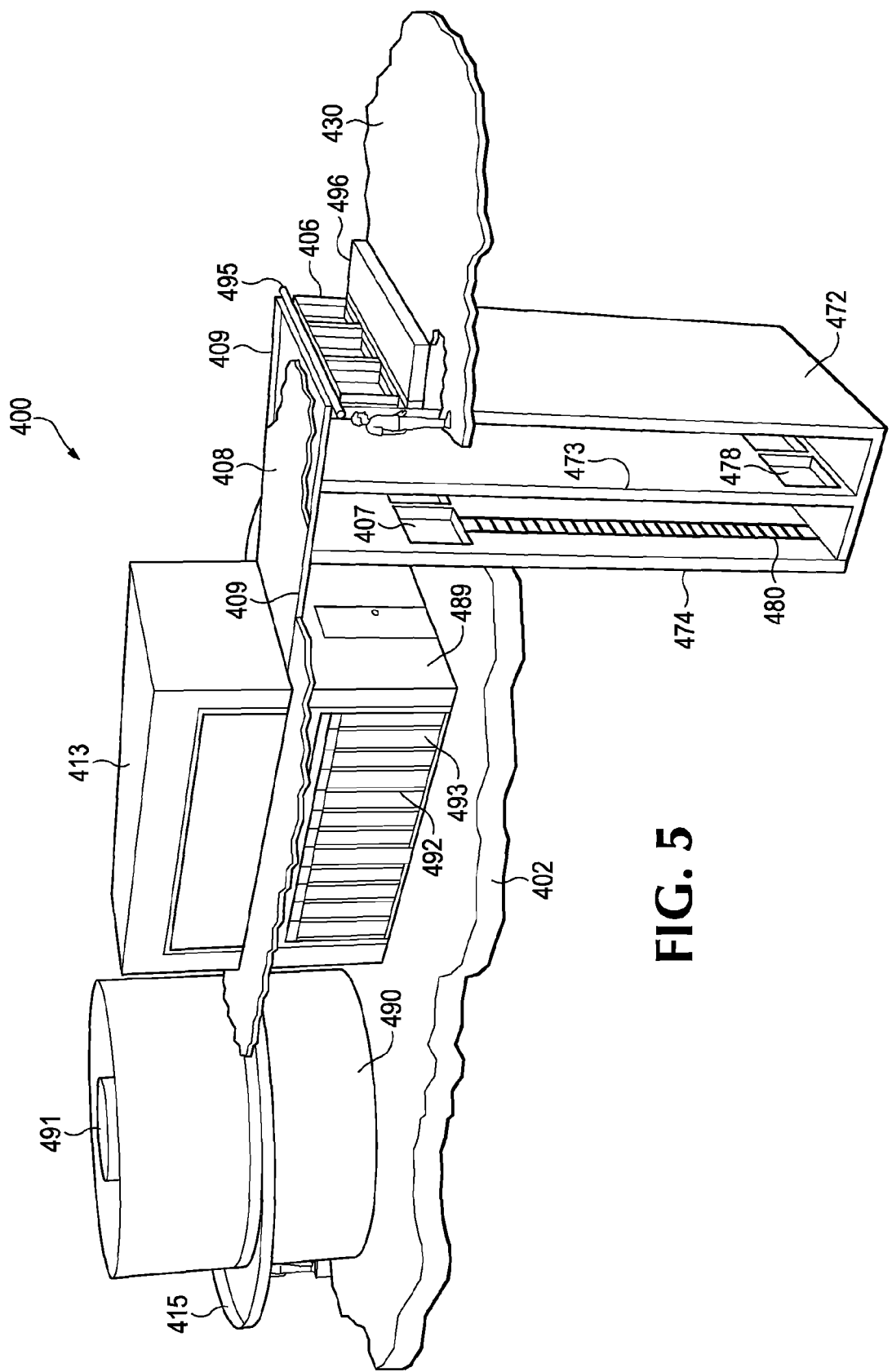
FIG. 5 illustrates a perspective view of the data center illustrated in FIG. 4 in accordance with certain embodiments of the disclosed technology.

FIGS. 4 and 5 illustrate top and perspective views, respectively, of a first example of a data center 400 that has a substantially underground base, a dome, (such as the dome 112 of FIGS. 1 and 2, for example), an internal ceiling 408, and multiple equipment rooms 480-490. In the example, the data center 400 is substantially circular in shape and may have a diameter of 50-130', for example. The internal ceiling may be above ground level 430 such that each of the equipment rooms 480-490 may be only partially subterranean, as described below. In certain embodiments, the data center 400 may allow for a total air flow between 50-1,000,000 cubic feet per minute (CFM), and preferably up to 400,000 CFM.

In the example, the base of the data center 400 includes a slab portion 402 that, in certain embodiments, may be formed from reinforced concrete and have a substantially circular shape with a diameter of 110' and a thickness of 12". The base also includes multiple substantially annular rings including an outer ring 472, an intermediate ring 473, and an inner ring 474. The annular rings 472-474 form an outer air chamber 476 between the outer ring 472 and the intermediate ring 473 and an inner air chamber 477 between the intermediate ring 473 and the inner ring 474.

In certain embodiments, each of the annular rings 472-474 may be concrete or metal walls having a height of 35' and terminating at their base with 24" footings. In embodiments where the slab portion 402 is at least substantially 10' below ground level 430, the annular rings 472-474 may extend an additional 25' below the slab portion 402. The rings 472-474 effectively form a ground-coupled vertical labyrinth heat exchanger for cooling air as is passes through the outer and inner air chambers 476 and 477 from outside the data center 400.

Air inlets 406, intermediate openings 478, and internal outlets 407 may facilitate air flow through the outer and inner chambers 476 and 477. The air inlets 406, intermediate openings 478, and internal outlets 407 may have the same height and width between 1' and 8', for example, and preferably approximately 3-5', to balance air flow therethrough. A parametric ratio may be maintained by ensuring that the total surface area provided by the air inlets 406 for passage therethrough is comparable to both the total surface area provided by the intermediate openings 478 and the total surface area provided by the internal outlets 407. In the example, each of the air inlets 406, intermediate openings 478, and internal outlets 407 include a series of equally-spaced windows but there is a wide variety of options available in designing the air inlets 406, intermediate openings 478, and internal outlets 407.

In certain embodiments, the air inlets 406, intermediate openings 478, and internal outlets 407 may be used by a person to access the internal portions of the data center 400. For example, a ladder (not shown) may be coupled with the outer ring 472 such that a person may enter the internal portion of the data center 400 through one of the air inlets 406 and climb down the ladder. The person may then pass through one of the intermediate openings 478. A separate ladder 480 may be coupled with the internal ring 474 such that the person may climb up the separate ladder 480 and then through one of the internal outlets 407. Any of a number of protocols may be established for people entering the data center 400 from outside the building.

Air filters may be implemented in connection with any or all of the air inlets 406, intermediate openings 478, and internal outlets 407. For example, any number of the air inlets 406, intermediate openings 478, and internal outlets 407 may be configured to support mesh stainless steel baskets. Such baskets may have a thickness of approximately 6"-12" and may be cleaned periodically or on an as-needed basis.

A spraying mechanism 495 may be implemented in connection with the filters. For example, a pipe having spray nozzles may be situated above the filters to periodically wash them down to remove dirt and debris by spraying water on them. Alternatively or in addition thereto, the spraying mechanism 495 may be used as an evaporative cooling mechanism to cool air as it travels through the air inlets 406 from outside the data center 400. For example, the evaporative cooling mechanism may be activated periodically or during particular occasions, e.g., on exceptionally hot days. The spraying mechanism may also be used to water a biofilter 496 that includes certain low-growing vegetation planted adjacent the air inlets 406.

In the example, the equipment rooms 480-490 are positioned on the slab portion 402 and at least substantially under the dome. The internal ceiling 408 may be positioned at least substantially 10' above the slab portion 402 and may include beams 409 configured to effectively define the shape of the internal ceiling 408 and also to at least substantially support the dome. The equipment rooms 480-490, the internal ceiling 408, and the slab portion 402, substantially form together an air chamber configured to receive air from outside the data center 400 by way of the substantially annular rings 472-474.

At least one of the equipment rooms 480-490 may be configured to house one or more electronic devices, e.g., servers and/or switching or other data equipment and, consequently, may be referred to as mini-data centers. In the example, one of the equipment rooms 489 houses a number of servers 492. In certain embodiments, more than one of the rooms 480-490 each house electronic devices such as servers and, in these situations, the devices may be distributed among the equipment rooms to satisfy any of a number of requirements such as per-room power consumption or temperature balancing within the data center 400.

In certain embodiments, at least one of the equipment rooms 480-490 includes an adjustable curtain or louver mechanism configured to control a flow of air through the corresponding equipment room. For example, the curtain in each of the rooms 480-490 may be adjusted at the same rate or level to distribute the effects of changing the airflow through the data center 400. Alternatively, the curtains in only some of the rooms 480-490 may be so adjusted. In yet further embodiments, the curtains in some or all of the rooms 480-490 may be individually adjusted, e.g., at different rates and/or levels.

Figure 6A:
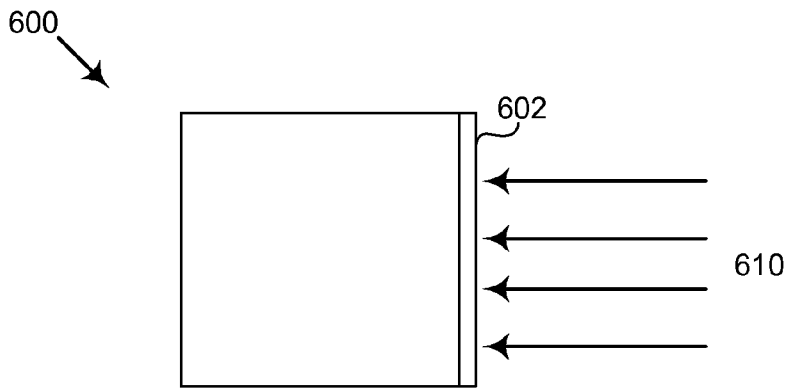
FIG. 6 illustrates an example of a data center equipment room having a controllable curtain in accordance with certain embodiments of the disclosed technology.
Figure 6B:
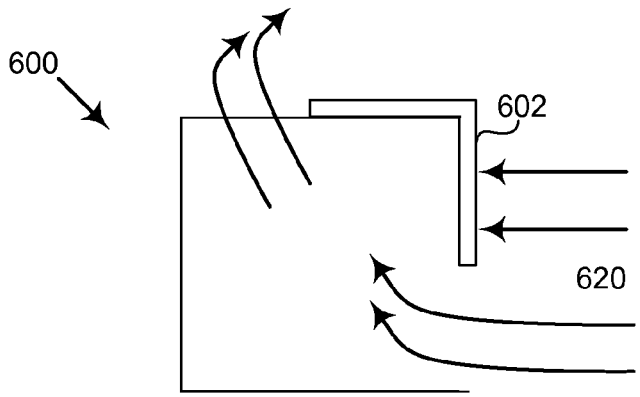
Figure 6C:
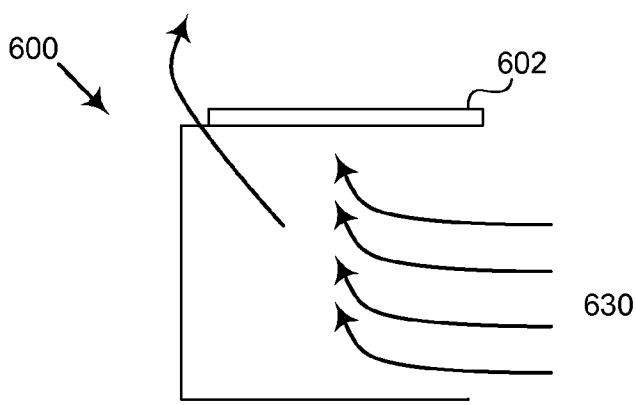

FIG. 6 illustrates an example of an equipment room 600 having a controllable curtain 602. A servo mechanism may be used to slidingly move the curtain 602 from a first position to any of a number of other positions, for example. In FIG. 6A, the curtain 602 is completely closed. As a result, cooling air is completely blocked from entering the equipment room 600, as indicated by 610. In FIG. 6B, the curtain 602 is partially open such that cooling air may enter the equipment room 600, as indicated by 620. In FIG. 6C, the curtain 602 is fully open such that all of the available cooling air may enter the equipment room 600 at a greater flow rate, as indicated by 630.

Returning to the example illustrated in FIGS. 4 and 5, one of equipment rooms (490) is a central equipment room that is substantially centered between the rest of the equipment rooms (480-489) resulting in a substantially hub-and-spoke-type arrangement. In other embodiments, the central equipment room may not be substantially centered between the other equipment rooms. For example, there may be only ten equipment rooms in total, one of which serves as the central equipment room. In yet other embodiments, there may not even be a central equipment room.

The central equipment room 490 may be at least substantially circular in shape and have a diameter of 30' and a height of 20'. In certain embodiments, the central equipment room 490 may have an inner core 491 that is substantially hollow and concentric and has a diameter of approximately 10'. The inner core 491 may provide termination points for incoming power, fiber optics, and copper wire circuits. A door may be provided to allow a person to access the inner core 491.

In the example, all of the non-central equipment rooms 480-489 have an isosceles-trapezoid-shaped perimeter. In certain embodiments, each of the non-central equipment rooms 480-489 may have a height of 20', a length of 15', a width of 7' at the narrow end, and a width of 15' at the wider end. Each of the rooms 480-489 may house 14 equipment racks, two redundant power distribution transformers, and two redundant three-phase power distribution track busses. The equipment room perimeter shape is a design choice, of course, but a trapezoid is a particularly effective use of space for a round building having a number of equipment rooms. Other room shapes are possible without deviating from the inventive concepts described herein.

Rack doors may be used as air intake grills for the corresponding room. False wall panels 493 may be used to replace rack doors when the corresponding racks are removed. For example, the false wall panels 493 may have the same size as the rack doors and positioned slidingly above the rack doors so that, each time a rack is removed, the corresponding false wall panel may be slid down to effectively take the place of the rack door that is no longer there to server as an air intake grill.

The central equipment room 490 may have a diameter of 10-50', and preferably 30', and serve as the entrance terminal for power and data circuits. The room 490 may house power circuits and fiber and copper data circuits as well as network distribution switch gear. An electrical connection such as a power supply 416 and a data connection 417, for example, may be established between the central equipment room 490 and at least one of the other equipment rooms 480-489. The connection may be housed by a cable distribution tray 415 configured to both support and protect the connection.

Any or all of the equipment rooms 480-490 in the data center 400 may act as convection chimneys. In the example, one of the rooms 489 has an exhauster louver 413 through which air may pass while traveling between the first and second chambers. Any or all of the other equipment rooms 480-488 and 490 may have a louver that is similar to or perhaps of a different type than the illustrated louver 413.

Any or all of the equipment rooms 480-490 may have shutters such as thermostatically-controlled rollable shutters, for example. In certain embodiments, a shutter moving mechanism may include, for example, a logic-directed servo drive to open or close any or all of the shutters when certain conditions occur. For example, many or all of the shutters may be closed during hot weather so that air internal to the data center 400 may be exhausted through the dome. The shutters may be partially open during cold weather and shutters or other comparable mechanism in the internal ceiling 408 may be partially closed to reclaim warm re-circulated air that is used to heat the data center 400. In certain situations, such as a fire, the shutter moving mechanism may automatically close all of the shutters.

The dome includes one or more air exhaust vents configured to allow air to pass from the second chamber to outside the data center 400. In certain embodiments, the air exhaust vents may be adjustable. For example, one or more of the air exhaust vents may be manually or automatically controlled to adjust the amount of air flow through the corresponding air exhaust vent for any of a number of different factors such as time of day or environmental conditions, e.g., external temperature or humidity. A solar power array may be mounted on the dome to provide renewable energy for ancillary usage such as internal illumination or powering the shutter moving mechanism described above.

Emergency generators and uninterruptible power supplies may provide power for the data center 400 by way of a surface-level connection between the generator structure and any or all of the equipment rooms 480-490. In certain embodiments, emergency power may be available to the central equipment room 490 from, for example, redundant flywheel uninterruptible power supplies and distributed to one or more of the other rooms 480-489. In these embodiments, the power may be stepped down and delivered to the other rooms 480-489 by way of a track busway system such as the 400-amp Starline Track Busway system by Universal Electric Corporation.

In certain embodiments, internal lighting for the data center 400 may be provided by way of low-energy LED lighting systems. Security monitoring may be provided by way of multiple networked cameras positioned around and within the data center 400. Such monitoring may be viewed and recorded on-site, remotely, or both. Electronic keycard access and biometric scanning may also be implemented to provide additional security for the data center 400.

An entrance (not shown) to the data center 400 may include a ramp that transitions from ground level 430 to the slab portion 402, e.g., 10' below grade. The ramp may be formed substantially from concrete and may be integrated into the structure of the data center 400. The ramp may also include a loading dock for equipment delivery, for example. One or more of the equipment rooms 480-490 may have a door through which a person may enter the room. The door(s) may be protected by any of a number of security measures.

Figure 7:
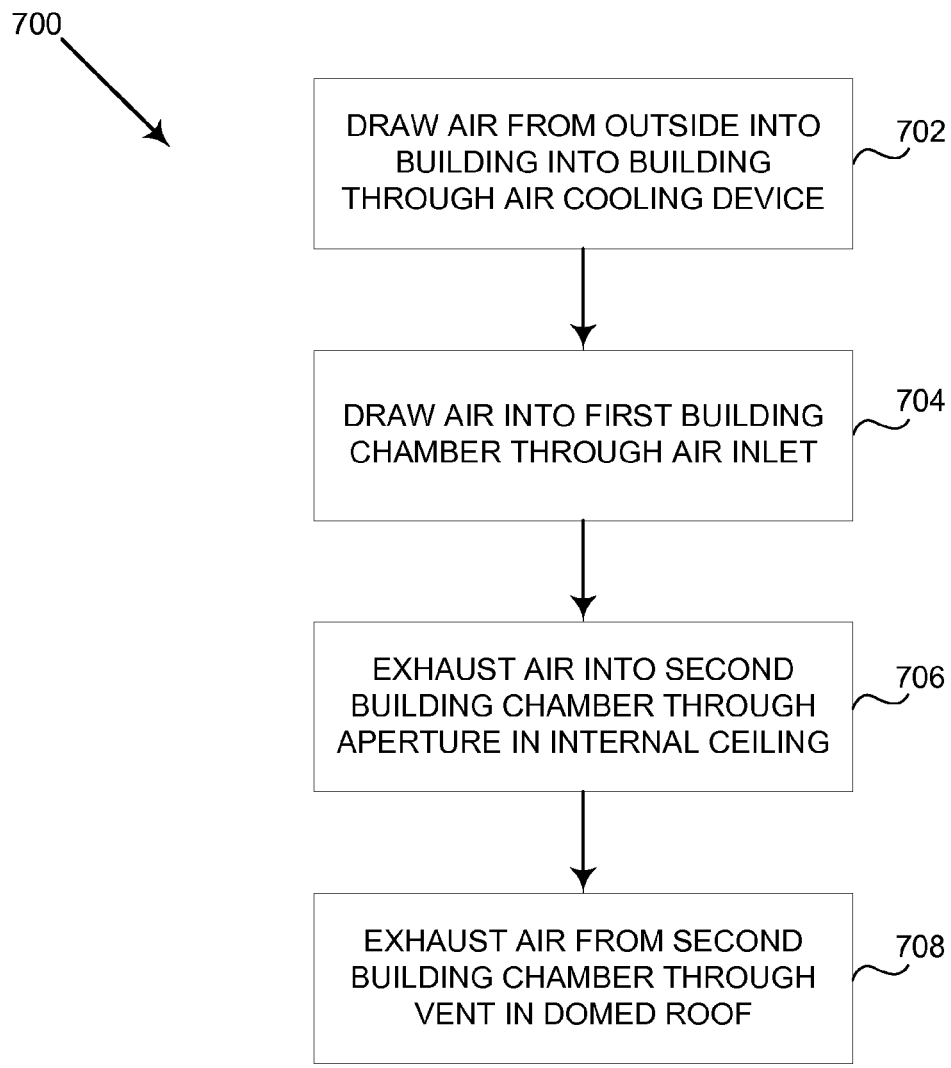
FIG. 7 illustrates a first example of a method of maintaining a temperature in a structure in accordance with certain embodiments of the disclosed technology.

FIG. 7 illustrates an example of a method 700 of maintaining a temperature in a structure, although many variations are possible. At 702, air is drawn from outside a building or structure into the building or structure through an air cooling device. In certain embodiments, the air cooling device may include a vertical labyrinth or earth cooling chamber that applies a thermal exchange process to the air as it travels through the vertical labyrinth. The vertical labyrinth may be at least substantially subterranean. In other embodiments, the air cooling device may include an evaporative cooling processor. In yet other embodiments, the air cooling device may include both a vertical labyrinth and an evaporative cooling processor proximate the vertical labyrinth.

In certain embodiments, the air may be filtered as it enters the air cooling device. Alternatively or in addition thereto, a biofilter process may be applied to the air prior to the air entering the air cooling device. For example, vegetation may be planted adjacent or otherwise near the location where the outside air is initially drawn into the building or structure.

At 704, the air drawn in from the air cooling device is drawn into an equipment room having air inputs that open to a first building chamber. The equipment room may be configured to house one or more electronic devices, e.g., servers.

At 706, the air is exhausted through an aperture in an internal ceiling of the first building chamber into a second building chamber. In certain embodiments, an air moving device may assist in the exhausting of the air into the second building chamber. In embodiments where the equipment room is housing one or more electronic devices, a fan or fans in the electronic device or devices may function as the air moving device.

At 708, the air in the second building chamber is exhausted from the second building chamber through a vent in a domed roof. In certain embodiments, the vent may be controllable to adjust the flow rate of the air moving therethrough. Alternatively or in addition thereto, an air moving device such as a fan may be positioned at or near the vent in the domed roof. In other embodiments, the air moving device may be positioned elsewhere within the building. In certain embodiments, the air moving device may include one or more fans disposed in connection with one or more electronic devices housed within the building.

Figure 8:
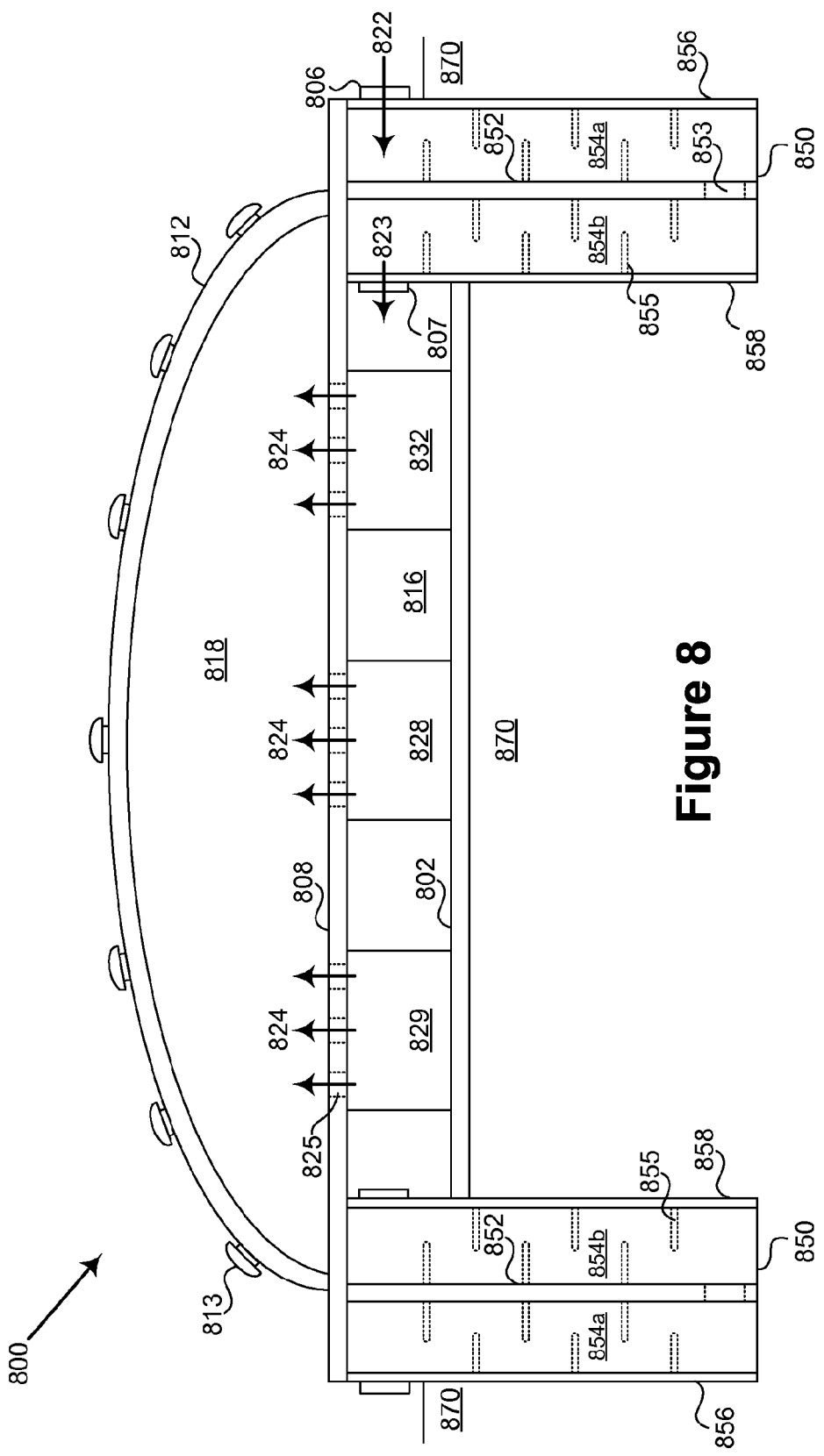
FIG. 8 illustrates a side view of another example of a data center in accordance with certain embodiments of the disclosed technology.
Figure 9:
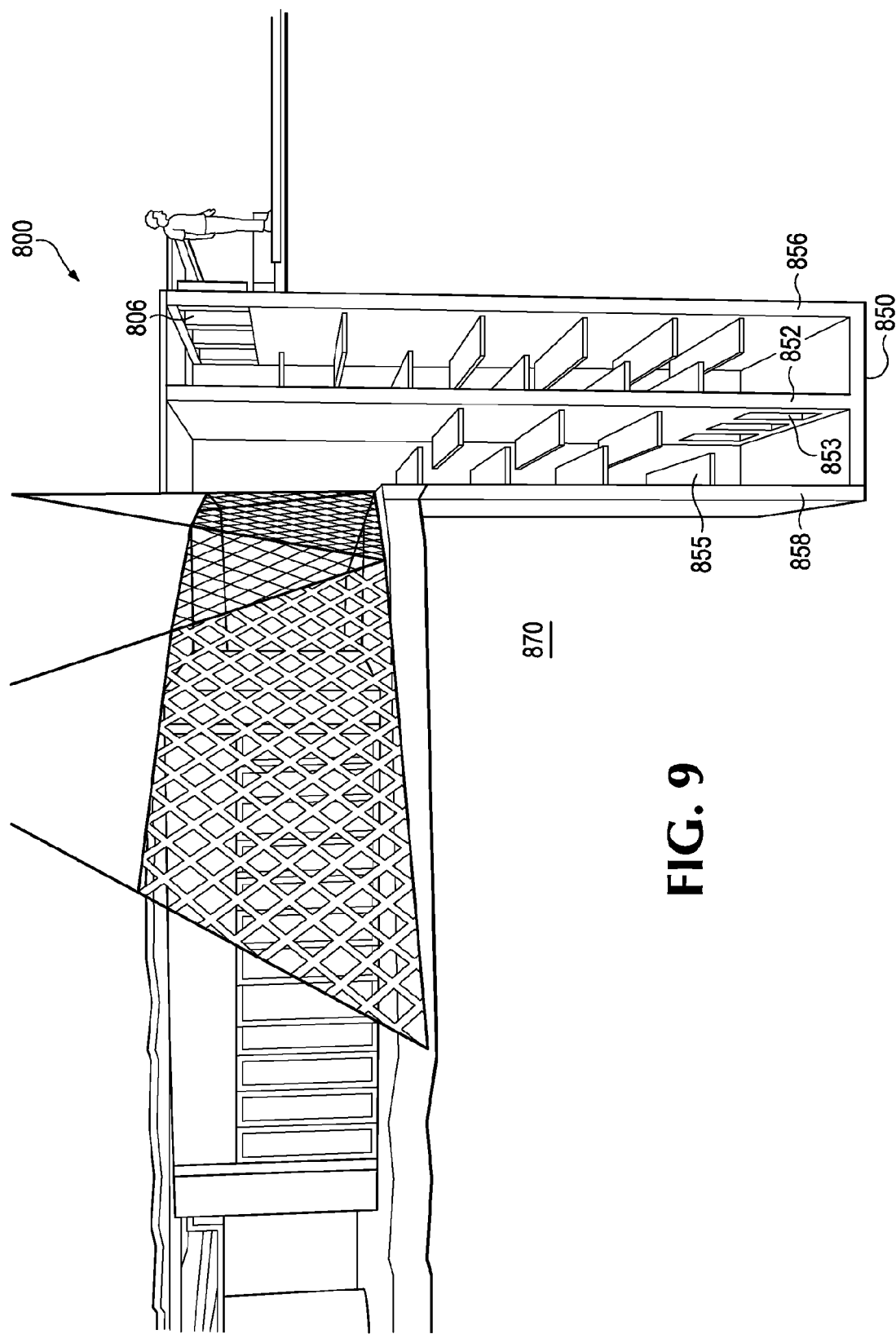
FIG. 9 illustrates a perspective view of the data center illustrated in FIG. 8 in accordance with certain embodiments of the disclosed technology.
Figure 10:
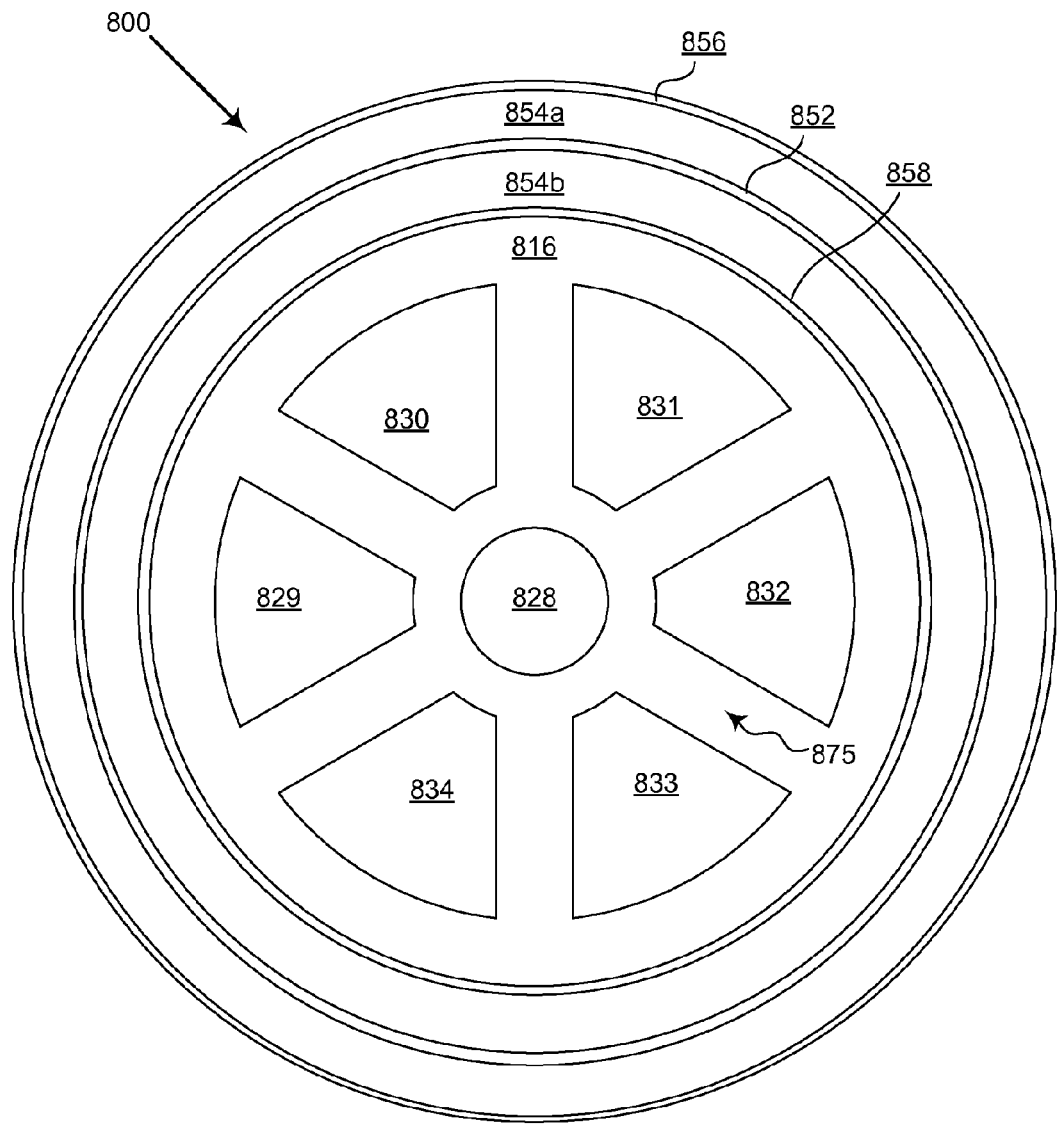
FIG. 10 illustrates a top view of the data center illustrated in FIG. 8 in accordance with certain embodiments of the disclosed technology.

FIGS. 8, 9, and 10 illustrate side, perspective, and top views, respectively, of another example of a data center 800 that is similar to the data center 400 illustrated in FIGS. 4 and 5. The data center 800 of FIGS. 8-10 has a substantially underground base 802, a dome 812, an internal ceiling 808, and multiple equipment rooms 828-834. Unlike the data center 400 of FIGS. 4 and 5, however, the internal ceiling 808 of the data center 800 of FIGS. 8-10 shares substantially the same plane as the top surfaces of each of the equipment rooms 828-834. Indeed, the internal ceiling 808 may function as the ceiling of one or more of the equipment rooms 828-834.

In the example, air may travel from outside the data center 800 through air inlets 806 into a cooling chamber 850, as shown by 822. The air may pass through an outer chamber 854a of the cooling chamber 850 into an inner chamber 854b by way of one or more intermediate openings 853 in a separating wall 852 that, along with outer and inner walls 856 and 858, respectively, define the outer and inner chambers 854a and 854b.

One or more thermally conductive structures such as thermal fins 855 may be used to aid in the cooling of the air as it passes through the cooling chamber 850 into a first chamber 816 by way of an inner opening 807, as shown by 823. The thermal fins 855 may provide turbulence for air as it passes through the cooling chamber 850 and may also be used to enhance a thermal transfer from the air to the ground 870. Internal thermally conductive structures, such as the thermal fins 855 of FIGS. 8-10, may be used in place of or in addition to external thermally conductive structures, such as the thermal fins 360 and 362 illustrated in FIG. 3.

Corridors 875 between the equipment rooms 828-834 allow for ease of equipment maneuvering and may also serve to maintain cubic flow in the first chamber 816. In the example, the air may pass from the first chamber 816 into a second chamber 818 by way of one or more internal openings 825 in each of the equipment rooms 828-834, as shown by 824. The openings 825 may be louver mechanisms or similar devices that may be manually or automatically controlled, individually or otherwise. In certain embodiments, one or more of the equipment rooms 828-834 may include an upblast fan (not shown) for additional assistance with air movement therethrough.

The air may leave the data center 800 from the second chamber 818 by way of multiple vents 813 coupled with the dome 812. The vents 813 may be gravity vents or comparable devices, for example. In certain embodiments, each vent 813 may provide an opening of approximately 2 square feet. Such embodiments may include approximately 750 vents 813 to provide a total opening size of approximately 1,500 square feet.

In certain embodiments, the total size of the openings provided by the vents 813 may be at least substantially similar to one or more of the total size of the openings provided by the internal openings 825, the total size of the openings provided by the inner openings 807, the total size of the openings provided by the intermediate openings 853, and the total size of the openings provided by the air inlets 806. In alternative embodiments, the total size of the openings provided by each successive stage may increase or decrease.

Having described and illustrated the principles of the invention with reference to illustrated embodiments, it will be recognized that the illustrated embodiments may be modified in arrangement and detail without departing from such principles, and may be combined in any desired manner. Further, although the foregoing discussion has focused on particular embodiments, other configurations are contemplated. In particular, even though expressions such as "according to an embodiment" or the like are used herein, these phrases are meant to generally reference embodiment possibilities and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only and should not be taken as limiting the scope of the invention. What is claimed as the invention, therefore, is all such modifications as may come within the scope and spirit of the following claims and equivalents thereto.

What is claimed is:

1. A building, comprising:
a floor;
a dome having a vent;
an internal ceiling substantially dividing areas underneath the dome into a first chamber substantially between the floor and the internal ceiling, and a second chamber substantially between the internal ceiling and the dome;
one or more equipment rooms positioned on the floor at least substantially under the dome in the first chamber, where for each equipment room of the one or more equipment rooms, the equipment room substantially forms an air chamber with the internal ceiling and the floor, the equipment room including air inputs for receiving air from the first chamber, and the internal ceiling having at least one aperture above the equipment room for venting air from the equipment room air chamber to the second chamber, wherein the one or more equipment rooms comprises a central equipment room substantially centered between two or more other equipment rooms and where the equipment rooms are positioned in the first chamber to form corridors between the equipment rooms sized to maintain a cubic air flow within the first chamber and to provide access to the equipment rooms, and further wherein the central equipment room is substantially circular in shape with an inner core that is substantially hollow and concentric and provides termination points for electrical and/or data connections from each of the two or more other equipment rooms, the central equipment room substantially centered between the two or more other equipment rooms to form a substantially hub-and-spoke-type arrangement of equipment rooms in the first chamber;
at least one air inlet disposed in the first chamber and configured to allow air to travel from outside the building into the first chamber; and
at least one air moving device configured to facilitate movement of air from outside the building, through the first and second chambers, and out through the vent of the dome.

2. A data center, comprising:
a base;
a dome having a plurality of air exhaust vents;
an internal ceiling substantially dividing areas underneath the dome into a first chamber substantially between the base and the internal ceiling, and a second chamber substantially between the internal ceiling and the dome;
a plurality of air inlets disposed in the first chamber and configured to allow air to travel from outside the data center into the first chamber; and
a plurality of equipment rooms positioned on the base and at least substantially under the dome that, with the internal ceiling and base, substantially form an air chamber configured to receive air from the first chamber and exhaust air to the second chamber, wherein the base is substantially underground and includes a plurality of substantially annular rings comprising an outer ring, an intermediate ring, and an inner ring, the plurality of annular rings forming an outer air chamber between the outer ring and the intermediate ring and an inner air chamber between the intermediate ring and the inner ring, and where the inner air chamber is in communication with the plurality of air inlets disposed in the first chamber.

3. The building of claim 1, wherein the floor is substantially subterranean.

4. The building of claim 1, further comprising an air cooling element disposed substantially at the at least one air inlet and configured to cool the air as it travels from outside the building into the first chamber.

5. The building of claim 4, wherein the air cooling element is an earth cooling chamber situated proximate the at least one air inlet and the first chamber and wherein the earth cooling chamber comprises a substantially vertical chamber through which air passes between an inlet and an exit.

6. The building of claim 5, wherein at least one wall of the earth cooling chamber is a thermal coupling medium between air in the earth cooling chamber and ground soil.

7. The building of claim 5, wherein the earth cooling chamber includes at least two ground soil-adjacent walls.

8. The building of claim 7, wherein the earth cooling chamber further comprises a blocking wall disposed between the at least two ground soil-adjacent walls and substantially dividing the earth cooling chamber into an outer sub-chamber and an inner sub-chamber.

9. The building of claim 7, further comprising a plurality of thermal fins coupled to at least one of the at least two ground soil-adjacent walls.

10. The building of claim 4, wherein the air cooling element comprises an evaporative cooling device.

11. The building of claim 1, wherein the at least one air inlet includes an air filter.

12. The building of claim 1, further comprising a biofilter proximate the at least one air inlet and structured to perform a biofilter function on air as it travels through the at least one air inlet.

13. The building of claim 1, wherein the at least one air moving device comprises a single boost fan disposed at the vent of the dome.

14. The building of claim 1, wherein surface areas of the at least one air inlet, the vent, and the apertures are sized to at least substantially maintain a parametric ratio of air flow for the movement of air from outside the building, through the first and second chambers, and out through the vent of the dome.

15. The data center of claim 2, wherein at least one of the plurality of equipment rooms is configured to house a plurality of servers.

16. The data center of claim 2, wherein at least one of the plurality of equipment rooms comprises an adjustable curtain configured to control a flow of air through the corresponding equipment room.

17. The data center of claim 2, further comprising a central equipment room positioned on the base and fully under the dome and substantially centered between the plurality of equipment rooms.

18. The data center of claim 17, wherein at least one of the plurality of equipment rooms has an isosceles-trapezoid-shaped perimeter.

19. The data center of claim 17, further comprising an electrical connection between the central equipment room and each of the plurality of equipment rooms.

20. The data center of claim 19, wherein the electrical connection comprises a power supply and a data connection.

21. The data center of claim 2, wherein the plurality of vents and the plurality of air inlets are sized to at least substantially maintain a parametric ratio for air flow through the plurality of equipment rooms.

22. A method of maintaining a temperature in a structure having a base, a domed roof, an internal ceiling between the base and the domed roof, a first building chamber between the base and the internal ceiling, a second building chamber between the dome and the internal ceiling, and a plurality of equipment rooms between the base and the internal ceiling, the base including a plurality of substantially annular tings comprising an outer ring, an intermediate ring, and an inner ring, the plurality of annular rings forming an outer air chamber between the outer ring and the intermediate ring and an inner air chamber between the intermediate ring and the inner ring, the method comprising:
    drawing air from outside the structure into the outer air chamber of the base;
    drawing the air from the outer air chamber of the base into the inner air chamber of the base;
    drawing the air from the inner air chamber of the base into the first building chamber through a plurality of air inlets disposed in the first building chamber;
    drawing the air from the first building chamber into each of the plurality of equipment rooms through air inputs that are open to the first building chamber;
    exhausting the air from each of the equipment rooms to the second building chamber; and
    exhausting the air from the second building chamber through a plurality of air exhaust vents in the domed roof.

23. The method of claim 22, wherein the plurality of annular rings together form a vertical labyrinth that applies a thermal exchange process to the air as it travels through the vertical labyrinth.

24. The method of claim 23, wherein the vertical labyrinth is substantially subterranean.

25. The method of claim 23, wherein the structure further comprises an evaporative cooling processor proximate the vertical labyrinth.

26. The method of claim 22, further comprising filtering the air as it enters the outer air chamber of the base.

27. The method of claim 22, further comprising applying a biofilter process to the air prior to the air entering the outer air chamber of the base.

28. The method of claim 22, further comprising at least substantially maintaining a parametric ratio of air flow through the first building chamber, the plurality of equipment rooms, and the plurality of air exhaust vents.

29. The building of claim 1, wherein the internal ceiling includes a recirculation aperture in addition to the apertures above the equipment rooms to allow air to travel between the first and second chambers.

30. The building of claim 29, wherein the recirculation aperture is controllable to adjust air flow between the first and second chambers.

31. The building of claim 1, wherein the at least one air moving device is controllable to adjust air flow through the building.

32. The building of claim 1, wherein the at least one air moving device is situated within the first chamber.

33. The building of claim 1, further comprising at least one electronic device within the one or more equipment rooms, the at least one electronic device including one or more fans structured to draw air from the first chamber and direct air through the at least one electronic device into the second chamber.

34. The building of claim 1, wherein a total surface area of the vent in the dome is at least substantially equal to a total surface area of the at least one air inlet.

35. The building of claim 1, wherein a total surface area of the vent in the dome is greater than or at least substantially equal to a total surface area of the apertures in the internal ceiling.

36. The building of claim 1, wherein a total surface area of the apertures in the internal ceiling is greater than or substantially equal to a total surface area of the at least one air inlet.

* * * * *